United States Patent [19]

Jakob et al.

[11] 4,047,242
[45] Sept. 6, 1977

[54] COMPACT ELECTRONIC CONTROL AND POWER UNIT STRUCTURE

[75] Inventors: Gert Jakob, Stuttgart; Siegfried Goetzke, Hemmingen, both of Germany

[73] Assignee: Robert Bosch G.m.b.H., Stuttgart, Germany

[21] Appl. No.: 682,061

[22] Filed: Apr. 30, 1976

[30] Foreign Application Priority Data

July 5, 1975 Germany .............................. 2530157

[51] Int. Cl.² .............................................. H05K 7/20
[52] U.S. Cl. .................................. 361/389; 361/388; 361/399; 339/147 P
[58] Field of Search ................. 174/52 R; 339/147 R, 339/147 P, 17 C, 17 L, 17 LC; 361/380, 386, 388, 389, 395, 399, 422, 424, 426

[56] References Cited

U.S. PATENT DOCUMENTS

| | | | |
|---|---|---|---|
| 2,777,893 | 1/1957 | De Rosso | 361/399 |
| 2,958,013 | 10/1960 | Ansley | 361/422 |
| 3,479,568 | 11/1969 | Shapiro | 361/424 |
| 3,852,643 | 12/1974 | Seki | 361/388 |
| 3,934,177 | 1/1976 | Horbach | 361/388 |

*Primary Examiner*—Gerald P. Tolin
*Attorney, Agent, or Firm*—Flynn & Frishauf

[57] ABSTRACT

To reduce the overall size of the housing of an electronic control unit having power stages of substantial power, and hence high heat dissipation, in combination with its associated control stage having but little power and hence low heat dissipation, a printed circuit board is located in the structure having essentially rectangular cross section by placing the printed circuit board diagonally therein, holding it in fixed position at one end but loose at the other to permit relative movement with respect to the housing, and thermal dimensional changes, the printed circuit board dividing the chamber into one permitting high heat dissipation and one of low heat dissipation. The structure is particularly applicable for automotive electrical control systems such as, for example, ignition systems for placing in cramped locations.

11 Claims, 4 Drawing Figures

COMPACT ELECTRONIC CONTROL AND POWER UNIT STRUCTURE

The present invention relates to an electronic control system and more particularly to an electronic control system for use in automotive vehicular application in which space is at a premium, but which further includes elements of vastly different power capacity and hence heat dissipation.

It has previously been proposed to locate electronic control units in a housing closed off by a cover, the housing including a printed circuit board which supports printed circuits and electronic components which have low heat dissipation, such as control transistors, coupling resistors and the like, and combine such a structure with power components of high heat dissipation. The power components were usually located at the outside, or separately with respect to the control components to permit radiation of heat.

Electronic control elements to which the present invention relates, typically use one or more transistors with the associated coupling resistors, capacitors and other circuit components which are used to control the switching modes of power transistors. The power portion of the control unit to which the invention relates includes one or more power transistors which are used to interrupt current flow, for example to interrupt current flow to the primary winding of an ignition coil.

Electronic control systems having vast differences in dissipated power between the control stage and the power stage usually were so constructed that the control stages, which dissipate little heat, were physically separated from the power stage which dissipates a good deal of heat. The control stage then included the various elements secured, for example, to a printed circuit board; the power transistors or other components dissipating heat in a power stage were then secured to a heat dissipating housing.

An overall electronic control unit has been proposed in which the printed circuit board which carries the control elements for the control electronics separates the housing into an upper and a lower space or chamber. The constructional elements for the control electronics are in the upper chamber; the elements for the power electronics are in the lower chamber. Such a unit has the disadvantage that the vertically staggered construction requires substantial size, that is, effectively a substantial height for the overall housing. In places where space is at a premium - for example under the hood of a motor vehicle, such units require a relatively large space. The interior space or chamber within the relatively large housing is poorly utilized.

It has also been proposed to provide electronic control units in which those elements in the control electronics which are secured to a printed circuit board are located adjacent a chamber of the housing which carries the constructional elements of the power stage. Such an element, while not very high, requires a substantially large placement surface. This, again, is disadvantageous when the unit is to be installed in the limited space available under the hood of automotive vehicles. The space factor of the element also is poor in that the space within the housing itself is not truly utilized.

It is an object of the present invention to provide an electronic control and power unit structure, particularly adapted (although not limited) to automotive electronic ignition systems and which have a control stage and a power stage and which requires little height, small attachment area and permits high packing density of the electronic components within the housing.

Subject matter of the present invention:

Briefly, the housing, in cross section, is essentially rectangular and a printed circuit board is located therein in diagonal direction, separating the interior of the housing in one chamber which includes those elements which have low power, and hence low heat dissipation, so that this chamber will include the elements raising the temperature therein but little; and into another chamber which includes the elements of the power stage.

In accordance with a feature of the invention, the printed circuit board and the components thereon are mechanically isolated from the connectors for external electrical connection in order to isolate the printed circuit board and the associated components from forces which may be unbalanced, off-center or twisting forces arising during connection of an external connector. The printed circuit board is formed as one unit together with a connecting strip to be inserted, for example by sliding, the printed circuit board and connector strip unit into the housing. Externally projecting contact lugs are mechanically secured to the contact strip and electrically with the conductors on the printed circuit board. The printed circuit board is connected electrically to the power stage; the chamber forming the power stage is formed with cooling ribs and the housing is made of a material carrying off heat and acting as a heat sink. Preferably, and in order to avoid temperature stresses and other stresses on the printed circuit board, the printed circuit board is held in the housing by resilient clips, or a rubber or plastic or other resilient holder at least at one end. The spring clips or resilient holders are preferably located in a cover closing off the housing which, in order to prevent moisture and contaminants from entering, is sealed to the remainder of the housing.

The invention will be described by way of example with reference to the accompanying drawings, wherein.

Figure 1:
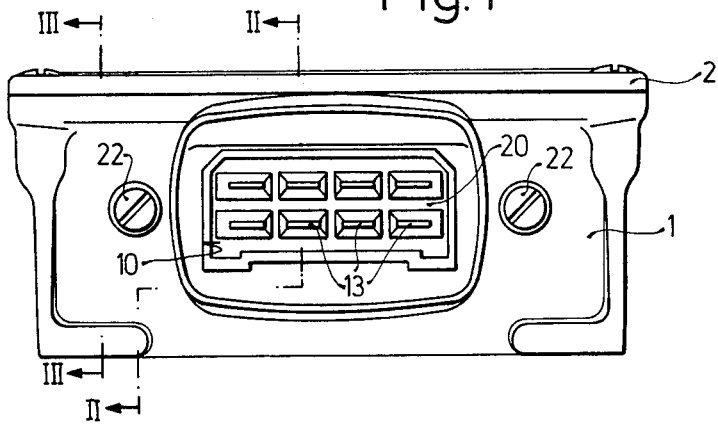
FIG. 1 is a side view of the electronic control and power unit structure.

Housing 1 (FIGS. 1, 2) is closed off by a cover plate 2. The edge of the housing 3 is formed with a groove 5 in which a sealing ring 4 is located. The sealing ring is surrounded at two sides by the edge 3 of the housing and at two sides by the cover 2 and a centering lip 6 formed on the cover (see FIGS. 2, 3). The sealing ring 4 can be placed in various ways; for example, it can be fitted into a groove in the edge 3 of the housing, surrounded thereby by three sides, the housing 2 pressing at the fourth side against the sealing ring 2. Alternatively, the sealing ring can be included in a groove in the housing.

Housing 1 is formed with attachment eyes 7 and internal attachment projections 8, as well as with cooling ribs 9. An opening 10 is formed in the housing opposite the location of the attachment eyes 7.

Figure 2:
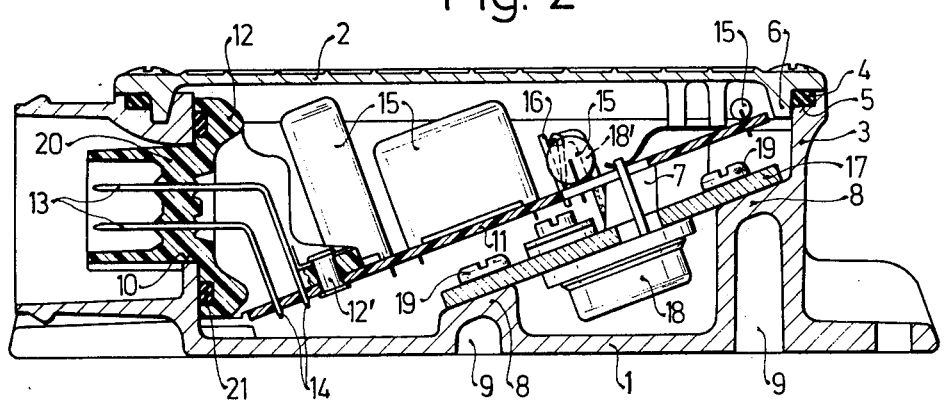
FIG. 2 is a longitudinal sectional view along line II—II of FIG. 1.
Figure 3:
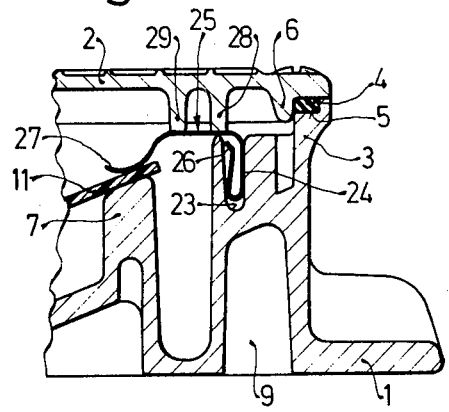
FIG. 3 is a fragmentary sectional view along line III—III of FIG. 1.

A printed circuit board 11, to which a printed circuit board is applied, is riveted to a connecting strip 12 by means of speed rivets 12'. The printed circuit board 11 and the connecting strip 12 form one constructional unit. The connecting strip 12 is made of insulating material. A plurality of connecting terminal lugs, for example eight, are molded into the connecting strip 12. Terminal lugs 13 extend with their terminal connecting ends from strip 12. The inner ends 14 of the terminal lugs 13 are bent and form contact flags for electrical connection with the electrical connectors on the printed circuit board 11. The printed circuit board 11 carries the electronic components 15 of a control circuit and solder junctions 16 for electrical connection with associated circuits. In mass production, the units can be assembled automatically by automatic insertion machines, and then connected by automatic soldering of the connections to the contacts of the printed circuit board, for example by wave soldering. The printed circuit board 11 then requires only a single test and adjustment. Some of the electronic components 15 may have substantial height; when the unit is used in combination with an electronic ignition system, some of the components 15 may be inductive units, as shown in FIG. 2.

In accordance with the invention, printed circuit board 11 is located within the housing 1 essentially diagonally, that is, at an inclination with respect to the terminal strip 12. The angle of inclination of the printed circuit board 11 depends on the length and the depth of the housing 1 through which printed circuit board 11 extends essentially diagonally. The various components of the control electronic portion or stage secured to the printed circuit board are preferably arranged according to height. This permits high packing factor and good space utilization of the space within housing 1. Locating the printed circuit board 11 at an inclination, as shown, permits use of a substantially smaller overall structure than if the elements were located in vertically stacked arrangement. Thus, due to the higher packing density of the elements 15, the length of the housing as well as its height can be reduced with respect to that of adjacent or vertically stacked location of the elements.

Power stage 18 of the control unit is secured to a base plate 17 by means of screws 19.

The terminal strip 12, the printed circuit board 11, and the electronic components 15 secured thereto, complete with the solder junction 16, and preferably pretested, are inserted in housing 1 by sliding the strip 12 with the section 20 surrounding the terminal lugs 13 into the opening 10 of the housing 1. A sealing ring 21 is located between the housing 1 and the terminal strip 12. The terminal strip 12 is secured to the housing 1 by means of screws 22.

Power stage 18 is connected by means of electrical connecting lines 18' (of which only one is shown for simplicity) to the respective solder junction point 16 (of which also only one is shown) to electrically connect the power stage 18 to the printed circuit board 11.

Housing 1 (FIG. 3) is formed with two notches or grooves 23 at the upper end near the upper terminal portion of the printed circuit board 11. A generally U-bent terminal portion 24 of a spring 25 is inserted into the groove 23, the end 26 of which is bent over to dig into the housing and prevent slipping out of spring 25 from the associated groove 23, and to hold the end of the spring 25 securely anchored in the associated groove 23. The free end 27 of the leaf spring presses the printed circuit board against the bearing eyes 7. This permits relative sliding movement of the printed circuit board 11 with respect to the bearing eyes 7, and eliminates stresses which could be transferred to the printed circuit board due to differential expansion coefficients between the printed circuit board and the material of the housing.

The spring 25 is additionally located by projections 28 formed in the interior of the housing 2. Projection 28 presses the spring 25 close to the edge of the material defining the groove 23. An additional cam 29, arranged laterally of the projection 28, increases the spring pressure of spring 28 against the printed circuit board.

Figure 4:
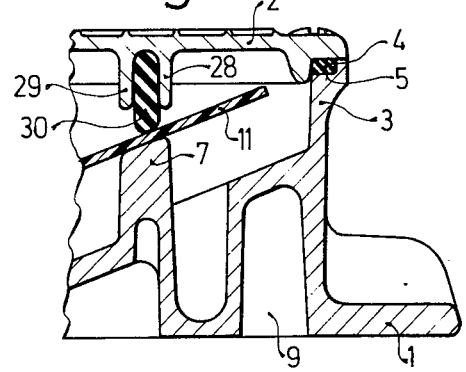
FIG. 4 is a fragmentary sectional view similar to FIG. 3 and taken along a similar section line and illustrating another embodiment of the invention.

Various changes and modifications may be made; for example the printed circuit board 11 can be held in position by pinching a rubber, plastic or other elastic strip or bumper 30 between the projections 28, 29, as seen in FIG. 4. The rubber bumper 30 presses the printed circuit board 11 against the bearing eyes 7 without, however, preventing expansion or contraction of the printed circuit board under differential temperature conditions.

Various other changes and modifications may be made, and features described in connection with any one of the embodiments may be used with any other within the inventive concept.

The power stage, typically transistor 18, is secured to a highly heat-conductive support plate 17 which is screwed by screws 19 tightly against the ribs 8 in the housing, so that good heat transfer and heat dissipation from the power transistor 18 to the housing, and hence cooling of the power transistor are ensured. At least the support plate 17 but preferably also the housing are made of good heat-conducting material, for example aluminum or the like.

Connecting stresses between the terminal lugs 13 of the connecting terminal and the printed circuit board 11 are effectively isolated from each other by the separate rivet connection effected by speed rivets 12' of the printed circuit board to the housing.

We claim:

1. Compact electronic control and power unit structure having
   a housing (1) of essentially rectangular cross section,
   a printed circuit board (11) located in the housing and carrying control elements and electrical conductors having relatively low heat generation, and a power stage (18), having relatively high heat generation, located in the housing;
   wherein, in accordance with the invention, said printed circuit board is located essentially diagonally across said substantially rectangular cross section in the housing and sub-dividing the interior of the space in the housing into two chambers, one chamber having said control elements and electrical conductors having relatively low heat generation located therein and the other chamber having said power stage (18) located therein.

2. Structure according to claim 1, wherein a connecting strip (12) carrying connecting terminals (13) is provided, secured to the printed circuit board (11) and forming one constructional unit therewith, the connecting terminals (13) projecting outside of the housing from the connecting strip and carrying internally extending extensions (14) electrically connected to electrical conductors on the printed circuit board (11).

3. Structure according to claim 2, wherein the ends (13) of the connecting terminals form terminal lugs for external connection and extend outside of the housing, the internal portions of the connecting terminals being connected to the printed circuit board;

and means (12') securing the printed circuit board in the housing to prevent transfer of connecting stresses applied against the externally projecting ends (13) of the connecting terminals to the printed circuit board (11).

4. Structure according to claim 1, wherein the housing is formed with cooling ribs (9) of heat-conductive material, the components of the power stage being secured in thermal communication with said cooling ribs;

and electrical connection means (16) are provided, electrically connecting the power stage (18) to the printed circuit board.

5. Structure according to claim 4, further comprising a support plate (17) for the components of the power stage (18) secured in heat-conductive relation to said cooling ribs of the housing and to the power-dissipating components of the power stage.

6. Structure according to claim 1, further comprising means (25; 30) resiliently securing the printed circuit board (11) within the housing to permit relative movement of the printed circuit board and the housing and hence differential expansion under changing thermal conditions.

7. Structure according to claim 6, wherein said resilient means comprises a spring (26) located within the housing (1) and holding the printed circuit board (11) against a shoulder (7) formed in the housing.

8. Structure according to claim 6, wherein the resilient means comprises bumper means (30) of resiliently compressible material engaging the contact strip (11) and pressing the contact strip against a support surface (7) formed in the housing while permitting relative sliding movement of the printed circuit board (11) and the housing.

9. Structure according to claim 1, further comprising sealing means sealing the cover of the housing.

10. Structure according to claim 3, further comprising sealing means sealing the cover of the housing and the contact strip against the outside of the housing to prevent penetration of moisture and contamination into the interior of the housing.

11. A structure according to claim 1 further forming a semiconductor electronic ignition system comprising a control stage including inductive components secured to said printed circuit board and located at one side thereof, and forming a portion of the control elements therefor, and at least one power transistor (18) forming the power stage.

* * * * *